(12) United States Patent  
Barrenscheen et al.

(10) Patent No.: US 8,947,126 B2  
(45) Date of Patent: Feb. 3, 2015

(54) SYSTEM, DRIVERS FOR SWITCHES AND METHODS FOR SYNCHRONIZING MEASUREMENTS OF ANALOG-TO-DIGITAL CONVERTERS

(75) Inventors: Jens Barrenscheen, Munich (DE); Laurent Beaurenaut, Neubiberg (DE)

(73) Assignee: Infineon Technologies Austria AG, Villach (AT)

( * ) Notice: Subject to any disclaimer, the term of this patent is extended or adjusted under 35 U.S.C. 154(b) by 56 days.

(21) Appl. No.: 13/269,889

(22) Filed: Oct. 10, 2011

(65) Prior Publication Data

US 2013/0088264 A1    Apr. 11, 2013

(51) Int. Cl.  
*H03K 3/00* (2006.01)  
*H03K 17/16* (2006.01)  
*H03K 17/689* (2006.01)

(52) U.S. Cl.  
CPC ............ *H03K 17/162* (2013.01); *H03K 17/689* (2013.01); *H03K 2217/0027* (2013.01); *H03K 2217/0063* (2013.01); *H03K 2217/0072* (2013.01)  
USPC ........... 327/108; 327/170; 327/379; 327/389; 327/109; 341/142; 341/155

(58) Field of Classification Search  
USPC ........................................................ 327/108  
See application file for complete search history.

(56) References Cited

U.S. PATENT DOCUMENTS

| | | | |
|---|---|---|---|
| 6,407,691 B1 * | 6/2002 | Yu ................................. | 341/155 |
| 6,445,330 B1 * | 9/2002 | Thomsen et al. ............. | 341/172 |
| 7,796,076 B2 * | 9/2010 | Melanson ..................... | 341/155 |
| 2001/0031012 A1 * | 10/2001 | Josefsson et al. ............. | 375/259 |
| 2008/0130781 A1 * | 6/2008 | Taghizadeh-Kaschani .. | 375/285 |
| 2008/0204289 A1 * | 8/2008 | Miettinen ..................... | 341/141 |
| 2009/0237966 A1 * | 9/2009 | Soenen et al. .................. | 363/74 |
| 2010/0244775 A1 * | 9/2010 | Smith ............................ | 320/140 |

* cited by examiner

*Primary Examiner* — Lincoln Donovan  
*Assistant Examiner* — Patrick Chen  
(74) *Attorney, Agent, or Firm* — Slater & Matsil, L.L.P.

(57) ABSTRACT

A driver for a switch includes a primary side having a trigger input and a secondary side comprising an analog-to-digital converter (ADC). The primary side and the secondary side are separated by a galvanic isolation barrier and communicate via a communication circuit. The primary side is configured to receive a trigger signal at the trigger input and forward the trigger signal to the ADC of the secondary side of the driver via the communication circuit. The ADC is configured to start a measurement upon receiving the trigger signal.

36 Claims, 4 Drawing Sheets

SYSTEM, DRIVERS FOR SWITCHES AND METHODS FOR SYNCHRONIZING MEASUREMENTS OF ANALOG-TO-DIGITAL CONVERTERS

TECHNICAL FIELD

The invention relates to a system, drivers for switches and methods for synchronizing measurements of analog-to-digital converters (ADCs), in particular, in safety-critical power systems with power switches.

BACKGROUND

Safety engineering is a growing field in which engineers use redundancy techniques in order to mitigate adverse consequences if an error occurs. For example, space vehicles and aircrafts include redundant systems so that if an engine control component fails during flight, for example, another engine control component can be activated to allow the aircraft to land safely.

In a similar regard, timed input/output (I/O) signals in safety conscious systems can be generated and then subsequently checked to ensure they were actually delivered correctly. This can be useful in any number of applications. For example, in an automotive system, if an output drive signal (e.g., sparkplug signal from an engine controller) is provided to an automobile's engine, a feedback signal (which is derived from the output drive signal that was actually delivered to the engine) can be compared with the original output drive signal to determine whether the output drive signal was, in fact, delivered correctly. Thus, if there is a "bad" connection between the engine controller and the engine itself (or if some other error event occurs), a comparison of the original drive signal and the feedback signal can detect this error, thereby allowing a control system to notify the driver, for example, by illuminating a "check engine" light on the driver's dashboard. In this way, a driver can be informed that an engine problem (e.g., a sparkplug misfire) has occurred, and can then get the vehicle serviced to remedy any corresponding problems.

In safety-critical power systems with power switches (e.g., metal-oxide-semiconductor field-effect transistors (MOSFETs) or insulated gate bipolar transistors (IGBTs)) there is the need to analyze functional blocks in the power system before starting the operation of the system to avoid damages in case of a malfunction of some functional blocks. Furthermore, diagnosis capability is needed during runtime to detect aging effects or analyze sudden failures.

A standard output of a normal control device is not capable of driving directly the control input (gate) of a power switch. Therefore, a gate driver component with its own power supply is needed to amplify the control signals and to adapt them to the needs of power switches. To avoid losses and to ensure a correct switching behavior, the gate driver components are normally located near to the power switch.

In some cases, the gate driver component introduces a galvanic isolation barrier between the control device and the power switch since they do not refer to the same potential. Here, the gate driver comprises a "low-voltage" primary side which is connected to the "low-power" control device and a "high-voltage" secondary side connected to the power switch, wherein the primary side and the secondary side are separated by a galvanic isolation barrier. As a consequence, the diagnosis capability of the complete system is reduced, since it is rather expensive to handle analog values under these conditions. It is particularly complex and costly to implement pre-warnings or repetitive measurements and transfer of data to the control device in high-voltage devices, for example.

More sophisticated diagnostics may utilize an analog-to-digital converter (ADC) which is integrated in the secondary side of the gate driver. Due to switching behavior and commutation noise (current changes of several kV/µs may occur at a phased node), noise effects can disturb ADC measurements.

Therefore, there, e.g., exists a need for a method and system for controlling ADC measurements in gate drivers for power switches which reduces impairment of the ADC measurements by noise effects.

SUMMARY OF THE INVENTION

In accordance with an aspect of the invention, there is provided a driver for a switch, the driver comprising a primary side having a trigger input and a secondary side comprising an analog-to-digital converter (ADC). The primary side and the secondary side are separated by a galvanic isolation barrier and communicate via a communication circuit. The primary side is configured to receive a trigger signal at the trigger input and forward the trigger signal to the ADC of the secondary side of the driver via the communication circuit, and the ADC is configured to start a measurement upon receiving the trigger signal.

In accordance with a further aspect of the invention, there is provided a method for synchronizing a measurement of an analog-to-digital converter (ADC) in a driver comprising a primary side having a trigger input and a secondary side comprising the ADC. The primary side and the secondary side are separated by a galvanic isolation barrier and communicate via a communication circuit. The method comprises receiving a trigger signal at the trigger input of the primary side of the driver and forwarding the trigger signal to the ADC of the secondary side of the driver via the communication circuit to cause the ADC to start a measurement.

Further features, aspects and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

DETAILED DESCRIPTION OF ILLUSTRATIVE EMBODIMENTS

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

Figure 1:
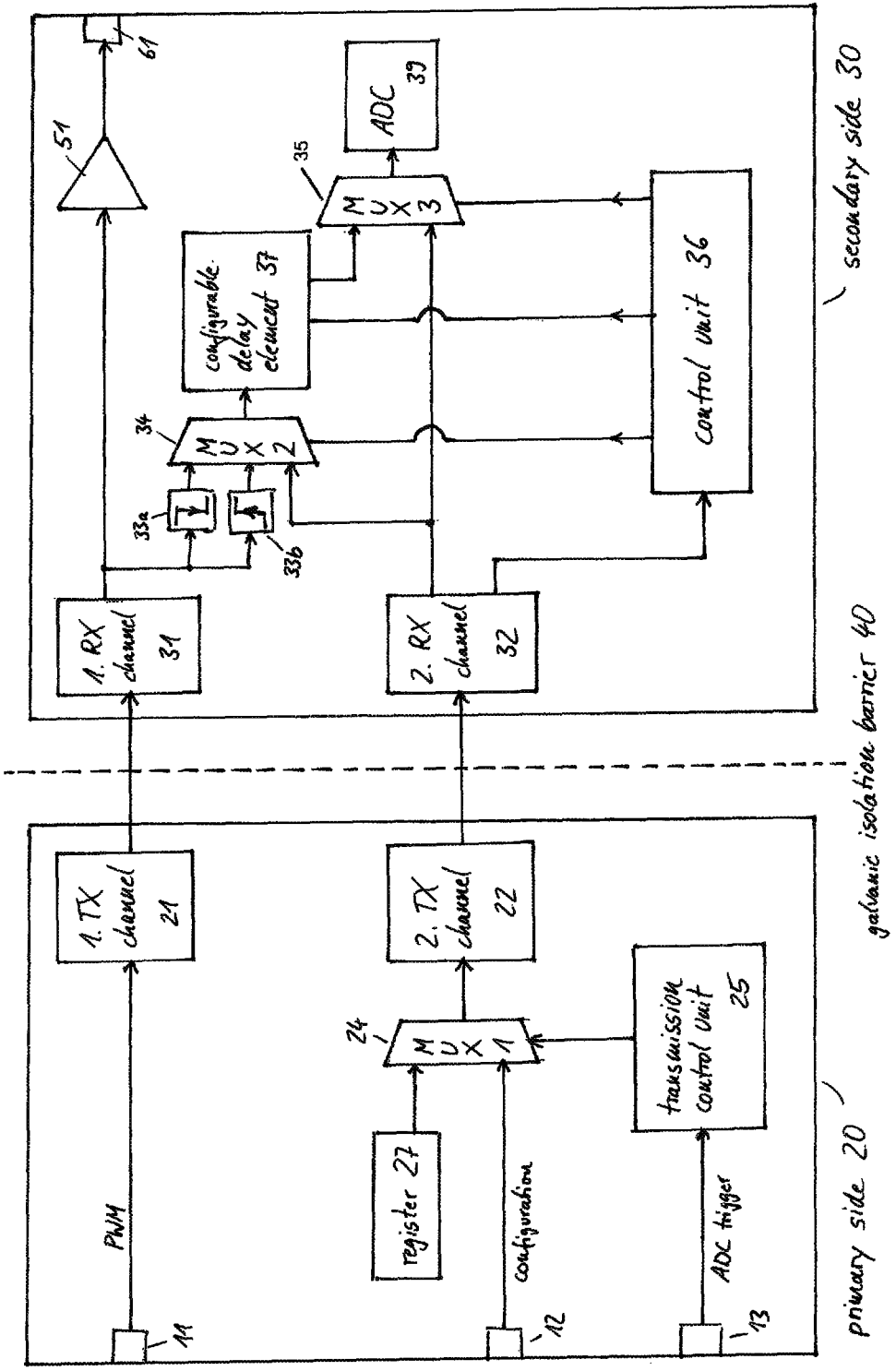
FIG. 1 exemplarily shows a simplified schematic diagram of a system according to an embodiment of the invention.

FIG. 1 exemplarily shows a simplified schematic diagram of a system according to an embodiment of the invention. The system comprises a primary side 20 and a secondary side 30 which are separated by a galvanic isolation barrier 40, as the primary side 20 and the secondary side 30 refer to different potentials. Communication between the primary side 20 and the secondary side 30 may be performed via suitable communication means or circuit (not shown in FIG. 1).

The primary side 20 comprises a pulse width modulation (PWM) signal input 11, a data input 12, an ADC trigger input 13, a first transmitter channel 21, a second transmitter channel 22, a first multiplexer 24, and a transmission control unit 25. The first transmitter channel 21 has its input connected to the PWM signal input 11, the second transmitter channel 22 has its input connected to the output of the first multiplexer 24. The multiplexer has its first input connected to a register 27, its second input connected to the data input 12 and its control input connected to the output of the transmission control unit 25. The transmission control unit 25 has its input connected to the ADC trigger input 13.

The secondary side 30 comprises a first receiver channel 31, a second receiver channel 32, a first edge detector 33a, a second edge detector 33b, a second multiplexer 34, a third multiplexer 35, a control unit 36, a configurable delay element 37, an ADC 39, e.g., a successive approximation ADC, an output stage 51, and an output 61.

The first receiver channel 31 has its input connected to the first transmitter channel 21 via a communication circuit (not shown in FIG. 1). The second receiver channel 32 has its input connected to the second transmitter channel 22 via the communication circuit or a further communication circuit (not shown in FIG. 1).

The first transmitter channel 21 and the second transmitter channel 22 are configured to transmit data over a galvanic isolation barrier (e.g., from the primary side 20 to the secondary side 30). The first receiver channel 31 and the second receiver channel 32 are configured to receive data over a galvanic isolation barrier (e.g., from the primary side 20). Depending on the bandwidth of the communication circuit, one or more transmitter/receiver channels may use the same communication circuit or each transmitter/receiver channel may use a separate communication circuit. The communication circuit may comprise inductive couplers such as coreless transformers, capacitive couplers, or optocouplers.

The first receiver channel 31 has its output connected to the input of the output stage 51 and the inputs of the first edge detector 33a and the second edge detector 33b. The output stage 51 has its output connected to output 61 which may be connected to a power switch (not shown in FIG. 1). The first edge detector 33a has its output connected to a first input of the second multiplexer 34 and the second edge detector 33b has its output connected to a second input of the second multiplexer 34.

The second receiver channel 32 has its first output connected to a third input of the second multiplexer 34 and a second input of the third multiplexer 35 and its second output connected to the input of the control unit 36. The second multiplexer 34 has its control input connected to a first output of the control unit 36 and its output connected to the input of the configurable delay element 37. The configurable delay element 37 has its control input connected to a second output of the control unit 36 and its output connected to a first input of the third multiplexer 35. The third multiplexer 35 has its control input connected to a third output of the control unit 36 and its output connected to the control input of the ADC 39.

The first transmitter channel 21 receives PWM control signals for controlling switching of an associated switch (not shown in FIG. 1) and transmits the PWM control signals via a communication circuit to the first receiver channel 31. The first receiver channel 31 forwards the PWM signal to the output stage 51 which amplifies the PWM signal and outputs the amplified PWM signal via output 61 to an associated switch to control the switching state of the switch. The first receiver channel 31 forwards the PWM signal also to the first and second edge detectors 33a, 33b which will be described below.

The first multiplexer 24 receives a signal comprising a direct request for an ADC measurement from a register 27 containing a codeword for the ADC conversion request at its first input and receives configuration data signals for the control unit 36 located in the secondary side 30 of the system. The transmission control unit 25 is connected to the ADC trigger input to receive ADC trigger signals. Dependent on receiving or not receiving an ADC trigger signal, the transmission control unit 25 controls the second transmitter channel 22 by means of the first multiplexer 24. When the transmission control unit 25 receives an ADC trigger signal from the ADC trigger input 13, the transmission control unit 25 causes the first multiplexer 24 to forward the signal received at its first input which comprises a request for an ADC measurement to the second transmitter channel 22. Otherwise, when the transmission control unit 25 does not receive an ADC trigger signal from the ADC trigger input 13, the transmission control unit 25 causes the second multiplexer 24 to forward the configuration data signals received at its second input to the second transmitter channel 22.

In devices without configuration capability, the configuration data path (as well as the multiplexer) can be omitted and an activation of the ADC trigger input 13 directly initiates transmission of the ADC conversion request code from register 27.

The second transmitter channel 22 transmits the received signal(s) to the second receiver channel 32 via a communication circuit.

Based on the type of signal(s) received, the second receiver channel 32 forwards the signal(s) to different destinations. The signal comprising a direct request for an ADC measurement is forwarded to the third input of the second multiplexer 34 and the second input of the third multiplexer 35, whereas the configuration data signals are forwarded to the control unit 36.

The first edge detector 33a and the second edge detector 33b receive the PWM control signal from the first receiver channel 31. The first edge detector 33a may be configured to detect a falling edge in the received signal and output an activation signal to the first input of the second multiplexer 34 upon detecting a falling edge in the received signal. The second edge detector 33b may be configured to detect a rising edge in the received signal and output an activation signal to the second input of the second multiplexer 34 upon detecting a rising edge in the received signal.

The control unit 36 controls the output of the second multiplexer 34 based on the received configuration data. Accordingly, the second multiplexer 34 outputs the activation signal of one of the edge detectors 33a and 33b or the signal comprising a direct request for an ADC measurement received from the second receiver channel 32 to the configurable delay element 37 which delays the signal received from the second multiplexer by a certain delay time which is specified by the control unit 36 based on the received configuration data.

The delayed signal is then output to the first input of the third multiplexer 35, which further receives the signal comprising a direct request for an ADC measurement from the second receiver channel 32. The control unit 36 controls the output of the third multiplexer 35 based on the received configuration data, i.e., the control unit 36 causes the third multiplexer 35 to forward either the delayed signal received from the configurable delay element 37 or the signal comprising a direct request for an ADC measurement to the ADC 39.

The ADC 39 is implemented at the secondary side of the gate driver to measure an analog value related to the secondary ground potential (in most cases the reference potential of the power switch). As the voltage range of the signals of the secondary side generally exceeds the input capability of the ADC, a voltage divider may be included.

The system described above allows to configure a trigger signal for an ADC measurement as required or desired by providing several options:

A) An ADC measurement may be directly triggered by an external trigger signal. In this case, an external trigger signal received at the ADC trigger input 13 causes transmission of a signal comprising a direct request for an ADC measurement. The first multiplexer 24 is controlled to forward the signal comprising a direct request for an ADC measurement to the second transmitter channel 22 which forwards the signal via the second receiver channel 32 to the third multiplexer 35. The third multiplexer 35 is then controlled to forward the signal which comprises a direct request for an ADC measurement to the ADC 39. Optionally, the signal comprising a direct request for an ADC measurement may be delayed by a configurable delay. Here, the second multiplexer 34 is controlled to forward the signal which comprises a direct request for an ADC measurement to the configurable delay element 37 and the third multiplexer 35 is then controlled to forward the delayed signal to the ADC 39.

As a further option, the trigger signal may inhibit data transmission of the second transmitter channel 22 to the second receiver channel 32 via the communication circuit as long as the trigger signal is active. Then, synchronized to, e.g., the falling edge of the trigger signal, the signal comprising a direct request for an ADC measurement may be transmitted by the second transmitter channel 22. With this, it is guaranteed that an ongoing data transmission can be completed before the signal comprising a direct request for an ADC measurement is transmitted an no further data transmission is started.

B) An ADC measurement is synchronized to an edge of the PWM control signal. In this case, the first multiplexer 24 is controlled to forward the configuration data signal(s) to the second transmitter channel 22 which transmits the signal(s) via the second receiver channel 32 to the control unit 36. As the transmission of configuration data via the communication circuit may be slow, this transmission takes place before any synchronized measurement of the ADC 39 is required. When an ADC measurement is to be synchronized to a falling edge of the PWM control signal, the second multiplexer 34 is controlled to forward the activation signal output by the first edge detector 33a to the configurable delay element 37 and, when an ADC measurement is to be synchronized to a rising edge of the PWM control signal, the second multiplexer 34 is controlled to forward the activation signal output by the second edge detector 33b to the configurable delay element 37. The activation signal of the first or second edge detector 33a, 33b is then delayed by a certain delay time specified by the control unit 36 based on the configuration data and forwarded to the third multiplexer 35 which is controlled to forward the delayed activation signal to the ADC 39.

Figure 2:
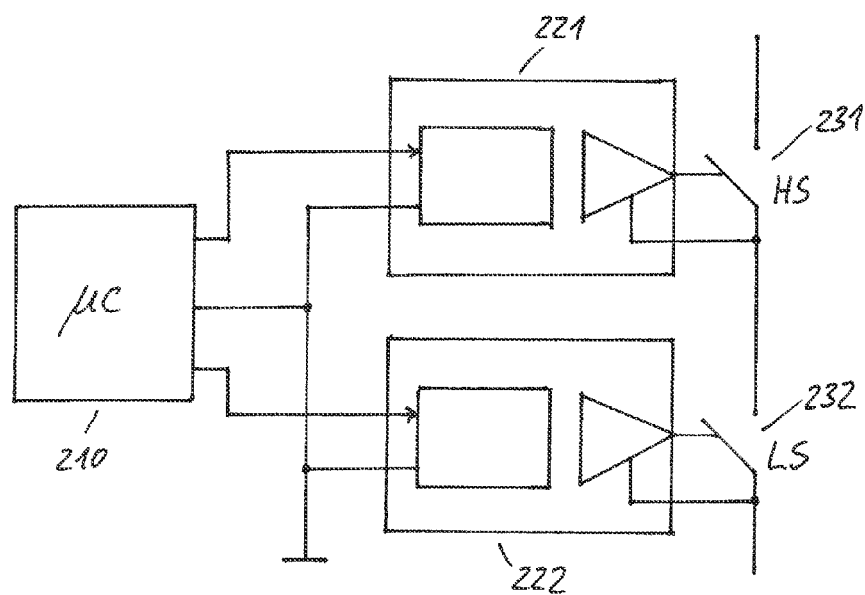
FIG. 2 shows a simplified schematic diagram of an exemplary half bridge wherein an embodiment of the invention may be implemented.

Option B as described above also allows to synchronize ADC measurements of the ADC 39 in a driver for a high-side switch and the ADC in a driver for a low-side switch of a half bridge. FIG. 2 shows a simplified schematic diagram of an exemplary half bridge wherein an embodiment of the invention may be implemented. Half bridges can be used for AC motors, wherein a control circuitry for a three phase motor comprises three half bridges, for example.

The exemplary half bridge illustrated in FIG. 2 comprises a high-side switch 231, a high-side switch driver 221 for driving the high-side switch 231, a low-side switch 232, a low-side switch driver 222 for driving the low-side switch 232, and a microcontroller 210 for controlling the high-side switch driver 221 and the low-side switch driver 222. The drivers 221 and 222 respectively comprise a galvanic isolation barrier as the microcontroller 210 and the switches 231 and 232 do not refer to the same potential.

Figure 3:
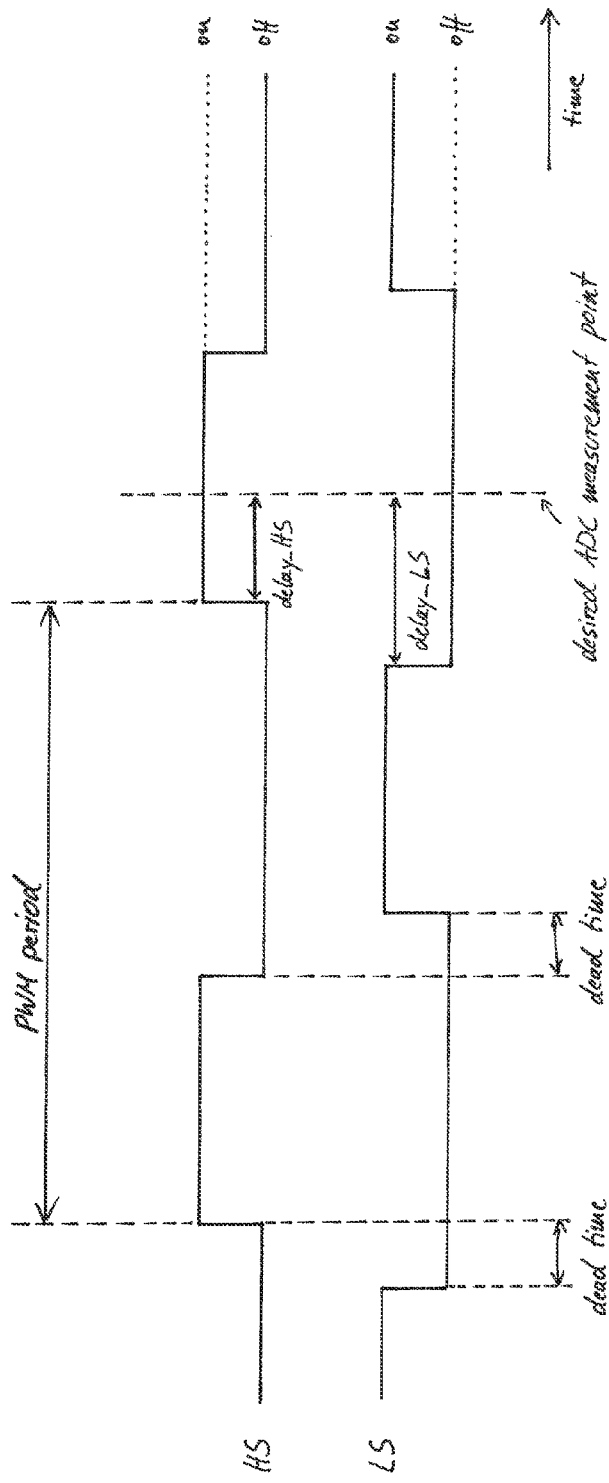
FIG. 3 illustrates an exemplary method for synchronizing ADC measurements in switch drivers according to a further embodiment of the invention.

FIG. 3 illustrates an exemplary method for synchronizing ADC measurements according to a further embodiment of the invention, which may be utilized in the drivers of the high-side and low-side switches of a half bridge such as the one shown in FIG. 2.

The ADC measurement of the high-side switch driver 221 may be triggered, after a first delay (delay_HS), by a rising edge of the PWM control signal for the high-side switch driver. The measurement of the low-side switch driver 222 may be triggered, after a second delay (delay_LS), by a falling edge of the PWM control signal for the low-side switch driver. Given that the delays are suitably specified, the ADC measurements can be started synchronously in the high-side switch driver and the low-side switch driver.

FIG. 3 shows the variation over time of the PWM control signals for a high-side switch driver and a low-side switch driver of a half bridge. The PWM control signals must not be high (i.e., "on" which means a closed switch) for both the high-side switch and the low-side switch of the half bridge at any time. Otherwise, the half bridge would be short-circuited.

In order to guarantee that both switches are never closed at the same time, additional "dead times" are introduced in the PWM control signals: When, for example, the PWM control signal for the low-side switch changes from "high" to "low" to open the low-side switch, the PWM control signal of the high side switch remains low for a certain time, the "dead time", before the PWM control signal changes to "high" to close the high side switch. Then, when the PWM control signal for the high-side changes from "high" to "low" to open the high-side switch, the PWM control signal of the low side switch remains low for the time duration of the "dead time", before the PWM control signal changes to "high" to close the low side switch. This approach for avoiding short-circuits in a half bridge is also called "brake before make". Thus, in this example, the dead time may be defined as a time period in which the PWM control signals for both the high-side switch and the low-side switch are low.

This dead time is a known value as the microprocessor which transmits the PWM control signals to the respective drivers also generates the dead time. Thus, the delays required for ADC synchronization can easily be calculated based on the known dead time. In the example according to FIG. 3, the ADC measurements are synchronized, if the first delay, delay_HS, and the second delay, delay_LS, satisfy the following equation:

$$\text{delay\_LS} = \text{delay\_HS} + \text{dead time} \quad (1)$$

It is to be appreciated that the synchronization of ADC measurements described above is only an example and other ways of synchronizing ADC measurements in a half bridge are also possible. For example, the ADC measurement of the high-side switch driver may be triggered, after a third delay (delay_HS'), by a falling edge of the PWM control signal for the high-side switch driver and the measurement of the low-side switch driver may be triggered, after a fourth delay (delay_LS'), by a rising edge of the PWM control signal for the low-side switch driver. In this case, the ADC measurements are synchronized, if the third delay, delay_HS', and the fourth delay, delay_LS', satisfy the following equation:

$$\text{delay\_HS'} = \text{delay\_LS'} + \text{dead time} \quad (1')$$

Figure 4:
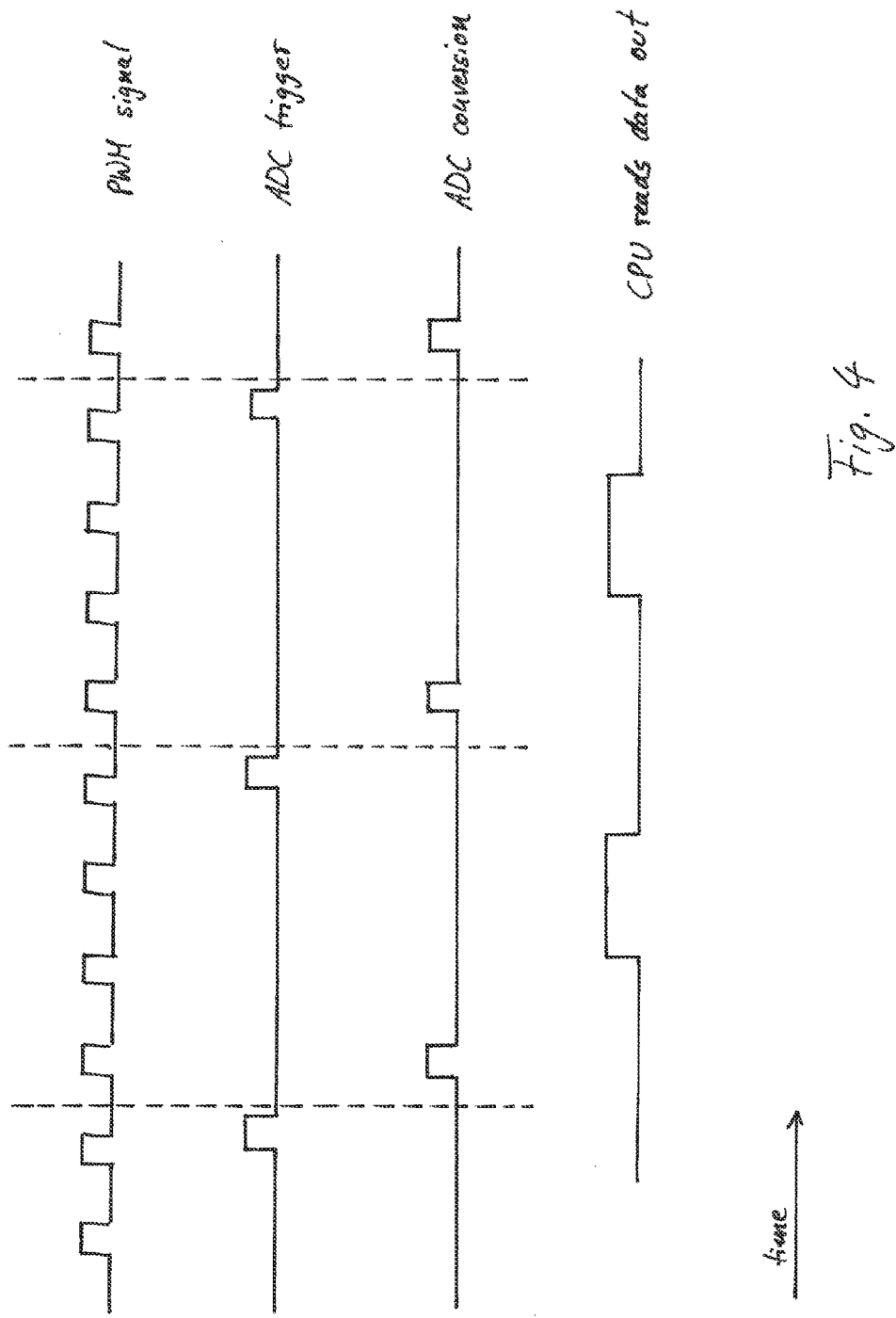
FIG. 4 illustrates a further exemplary method for synchronizing ADC measurements in switch drivers according to a further embodiment of the invention.

FIG. 4 illustrates a further exemplary method for synchronizing ADC measurements in switch drivers according to a further embodiment of the invention. Here, the ADC measurement is synchronized to an edge of a PWM control signal received by the switch driver in a way similar to the ADC synchronization described with reference to FIG. 1 as Option B. However, the ADC measurement is not triggered by each edge of the PWM signal which meets the respective condition, but only when an additional external trigger signal is received by the switch driver. More precisely, the external trigger signal requests an ADC measurement which is synchronized to the next edge of the PWM control signal which meets the respective condition (e.g., either a falling edge or a rising edge).

In this approach, more time passes between the individual ADC measurements which ensures that a microcontroller which reads out the data from the ADC between subsequent separate measurements obtains compatible measurement data, i.e., measurement data of only one single ADC measurement. Accordingly, this approach prevents the microprocessor from reading a portion of a first ADC measurement and then, as a new measurement has already been carried out by the ADC, a portion of a second, subsequent ADC measurement instead one a whole data set of one single ADC measurement.

Furthermore, in numerous applications, ADC data is not always required at a high frequency. This embodiment allows to configure the time intervals lying between ADC measurements carried out periodically thereby avoiding generation of large amounts of data which is not required.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A driver for a switch, the driver comprising:
a primary side having a trigger input and a pulse width modulation (PWM) signal input;
a secondary side comprising an analog-to-digital converter (ADC), wherein the primary side and the secondary side are configured to be separated by a galvanic isolation barrier;
a first communication channel and a second communication channel, wherein the primary side and the secondary side communicate over the galvanic isolation barrier via the first and the second communication channels;
wherein the primary side is configured to receive a trigger signal at the trigger input and forward the trigger signal to the ADC of the secondary side of the driver via the first communication channel;
wherein the primary side is configured to receive a PWM signal at the PWM signal input and forward the PWM signal to the ADC of the secondary side of the driver via the second communication channel;
wherein the secondary side comprises a multiplexer configured to output a delayed signal of the PWM signal or the trigger signal to the ADC; and
wherein the ADC is configured to start a measurement upon receiving the trigger signal.

2. The driver of claim 1, wherein the first or the second communication channel comprises an inductive coupler.

3. The driver of claim 1, wherein the first or the second communication channel comprises a coreless transformer.

4. The driver of claim 1, wherein the primary side and the secondary side are configured to transfer configuration data and trigger requests and, as long as the trigger signal is enabled, only trigger requests are transmitted via the first communication channel.

5. The driver of claim 1, wherein the primary side comprises:
a configuration data input;
a transmission control unit coupled to the trigger input; and
a multiplexer coupled to the output of the configuration data input, the output of the multiplexer coupled to the first communication channel, a control input of the multiplex coupled to an output of the transmission control unit.

6. The driver of claim 1, further comprising a galvanic isolation layer between an outer edge of the primary side and an outer edge of the second side, wherein the first communication channel and the second communication channel are formed through the galvanic isolation layer.

7. The driver of claim 1, wherein the secondary side comprises:
a first receiving channel coupled to the second communication channel;
an output stage comprising an input coupled to an output of the first receiving channel and an output coupled to a switch, the output stage being configured to amplify the PWM signal;
an edge detector comprising an input coupled to the output of the first receiving channel;
a first multiplexer comprising a first input and a second input, wherein an output of the edge detector is coupled to the first input of the first multiplexer,
a configurable delay element coupled to an output of the first multiplexer;
a second receiving channel coupled to the first communication channel and configured to receive a data signal comprising configuration data and trigger signal, wherein the second receiving channel comprises a first output configured to send the trigger signal and a second output configured to send configuration data, wherein the second input of the first multiplexer is coupled to the first output of the second receiving channel;
a control unit coupled to the second output of the second receiving channel, a first output of the control unit comprising delay time coupled to a control input of the configurable delay element; and the multiplexer comprising a first input and a second input, the first input coupled to a output of the configurable delay element, the second input coupled to the first output of the second receiving channel, and a control input coupled to a second output of the control unit.

8. The driver of claim 1, wherein the secondary side comprises:
a first receiving channel coupled to the second communication channel;
an edge detector comprising an input coupled to the output of the first receiving channel;
a first multiplexer comprising a first input and a second input, wherein an output of the edge detector is coupled to the first input of the first multiplexer;
a configurable delay element configured to generate a delayed signal of the PWM signal and coupled to an output of the first multiplexer; and
a second receiving channel coupled to the first communication channel and configured to receive a data signal comprising configuration data and trigger signal, wherein the second receiving channel comprises a first output configured to send the trigger signal and a second output configured to send configuration data, wherein the second input of the first multiplexer is coupled to the first output of the second receiving channel.

9. The driver of claim 8, wherein the secondary side further comprises:
a control unit coupled to the second output of the second receiving channel, a first output of the control unit comprising delay time coupled to a control input of the configurable delay element; and
the multiplexer comprising a first input and a second input, the first input coupled to a output of the configurable delay element, the second input coupled to the first output of the second receiving channel, and a control input coupled to a second output of the control unit.

10. The driver of claim 1, wherein the multiplexer comprises a first input, a second input, and an output coupled to an input of the ADC, the first input coupled to the delayed signal of the PWM signal, the second input coupled to the first communication channel.

11. The driver of claim 10, wherein the secondary side comprises a configurable delay element configured to generate the delayed signal of the PWM signal and coupled to the second communication channel.

12. A method for synchronizing a measurement of an analog-to-digital converter (ADC) in a driver comprising a primary side having a trigger input and a pulse width modulation (PWM) signal input, the driver further comprising a secondary side comprising the ADC and a multiplexer, wherein the primary side and the secondary side are separated by a galvanic isolation barrier and communicate via a first communication circuit and a second communication circuit, the method comprising:
receiving a trigger signal at the trigger input of the primary side of the driver;
forwarding the trigger signal to the ADC of the secondary side of the driver via the first communication circuit and the multiplexer to cause the ADC to start a measurement;
receiving a PWM signal at the PWM signal input of the primary side of the driver; and
forwarding the PWM signal to the multiplexer via the second communication circuit for synchronizing the measurement.

13. The method of claim 12, wherein the communication circuit comprises an inductive coupler.

14. The method of claim 12, wherein the communication circuit comprises a coreless transformer.

15. The method of claim 12, wherein the primary side and the secondary side are configured to transfer configuration data and trigger requests and, as long as the trigger signal is enabled, only trigger requests are transmitted via the communication circuit.

16. The method of claim 12, wherein the trigger signal is also received by a further driver comprising a further primary side having a further trigger input and a further secondary side comprising a further ADC, wherein the further primary side and the further secondary side are separated by a further galvanic isolation barrier and communicate via a further communication circuit, the method further comprising:
receiving the trigger signal at the further trigger input of the further primary side of the further driver; and
forwarding the further trigger signal to the further ADC of the further secondary side of the further driver via the further communication circuit to cause the further ADC to start a further measurement essentially synchronously with the measurement of the ADC.

17. A driver for a switch, the driver comprising:
a primary side connected to a control unit, the primary side comprising a trigger input, and a pulse width modulation (PWM) signal input; and
a secondary side connected to a switch and comprising an analog-to-digital converter (ADC) for measuring a value related to the switch, wherein the primary side and the secondary side are separated by a galvanic isolation barrier and communicate via a first communication channel and a second communication channel;
wherein the primary side is configured to receive a trigger signal at the trigger input and forward the trigger signal to the ADC of the secondary side of the driver via the first communication channel;
wherein the primary side is configured to receive a PWM control signal at the PWM signal input from the control unit and to transmit, via the second communication channel, the received PWM control signal to the secondary side to control an output of the driver to the switch;
wherein the secondary side comprises a multiplexer configured to output a delayed signal of the PWM signal or the trigger signal to the ADC; and
wherein the secondary side is configured to synchronize a measurement of the ADC with the PWM control signal.

18. The driver of claim 17, wherein the ADC is a successive approximation ADC.

19. The driver of claim 17, wherein the first communication channel or the second communication channel comprises a coreless transformer.

20. The driver of claim 17, wherein the secondary side further comprises an edge detector for detecting a falling edge or a rising edge of the PWM control signal.

21. The driver of claim 17, wherein either a falling edge or a rising edge of the PWM control signal initiates a start of the measurement of the ADC.

22. The driver of claim 17, wherein either a falling edge or a rising edge of the PWM control signal initiates a start of the measurement of the ADC after a configurable delay.

23. The driver of claim 17, wherein the primary side further comprises a trigger circuit configured to receive an external trigger at the trigger input, wherein the measurement of the ADC is triggered by a falling or rising edge of the PWM control signal only when the external trigger is enabled.

24. The driver of claim 23, wherein the trigger circuit comprises an input pin, a timer, or a register configured to be written by a microcontroller.

25. A method for synchronizing a measurement of an analog-to-digital converter (ADC) in a driver comprising a primary side connected to a control unit and a secondary side connected to a switch and comprising the ADC configured to measure a value related to the switch, and a multiplexer, wherein the primary side and the secondary side are separated by a galvanic isolation barrier and communicate via a first communication circuit and a second communication circuit, wherein the method comprises:
   receiving, by the primary side, a pulse width modulation (PWM) control signal transmitted by the control unit;
   receiving, by the primary side, a trigger signal;
   transmitting, by the primary side, via the first communication circuit, the received PWM control signal to the multiplexer to control an output of the driver to the switch;
   transmitting, by the primary side, via the second communication circuit and the multiplexer, the received trigger signal to the secondary side for use in a measurement of the ADC; and
   synchronizing the measurement of the ADC with the PWM control signal by utilizing edges of the PWM control signal for triggering measurement of the ADC.

26. The method of claim 25, wherein the communication circuit comprises a coreless transformer.

27. The method of claim 25, wherein either a falling edge or a rising edge of the PWM control signal initiates a start of the measurement of the ADC, the measurement being accomplished before the falling/rising edge of the PWM control signal results in a change of a driving signal for the switch due to a delay of the driver.

28. The method of claim 25, wherein either a falling edge or a rising edge of the PWM control signal initiates the start of the measurement of the ADC after a configurable delay.

29. The method of claim 25, wherein the measurement of the ADC is triggered by a falling or rising edge of the PWM signal only when the trigger signal is enabled.

30. The method of claim 25, further comprising transmitting, by the control unit, the PWM control signal to the primary side of the driver.

31. A driver for a switch, the driver comprising:
   a primary side having a trigger input and a pulse width modulation (PWM) signal input;
   a secondary side configured to be separated from the primary side by a galvanic isolation barrier;
   a first communication channel and a second communication channel, wherein the primary side and the secondary side communicate over the galvanic isolation barrier via the first and the second communication channels, wherein the primary side is configured to receive a PWM signal at the PWM signal input and forward the PWM signal to the secondary side of the driver via the second communication channel;
   wherein the secondary side comprises:
      a first receiving channel coupled to the second communication channel;
      a second receiving channel coupled to the first communication channel and configured to receive a data signal comprising configuration data and trigger signal, wherein the second receiving channel comprises a first output configured to send the trigger signal and a second output configured to send configuration data;
      a control unit coupled to the second output of the second receiving channel;
      a multiplexer comprising a first input and a second input, the first input coupled to a output of a configurable delay element, the second input coupled to the first output of the second receiving channel, and a control input coupled to a second output of the control unit; and
      an analog-to-digital converter (ADC) having an input coupled to an output of the multiplexer, wherein the ADC is configured to start a measurement upon receiving the trigger signal.

32. The driver of claim 31, wherein the configurable delay element is configured to generate a delayed signal of the PWM signal and coupled to the first receiving channel, wherein the configurable delay element is further coupled to the first output of the second receiving channel.

33. The driver of claim 32 wherein a first output of the control unit comprising delay time coupled to a control input of the configurable delay element.

34. The driver of claim 31, wherein the first or the second communication channel comprises an inductive coupler.

35. The driver of claim 31, wherein the first or the second communication channel comprises a coreless transformer.

36. The driver of claim 31, wherein the primary side and the secondary side are configured to transfer configuration data and trigger requests and, as long as the trigger signal is enabled, only trigger requests are transmitted via the first communication channel.

* * * * *